(12) United States Patent
Liang et al.

(10) Patent No.: US 11,342,480 B2
(45) Date of Patent: May 24, 2022

(54) DETECTION DEVICE FOR MICRO-LED AND MANUFACTURING METHOD THEREOF, AND DETECTION APPARATUS FOR MICRO-LED

(71) Applicant: BOE TECHNOLOGY GROUP CO., LTD., Beijing (CN)

(72) Inventors: Zhiwei Liang, Beijing (CN); Wenqian Luo, Beijing (CN); Shibo Jiao, Beijing (CN); Feng Wang, Beijing (CN); Yingwei Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 91 days.

(21) Appl. No.: 16/855,351

(22) Filed: Apr. 22, 2020

(65) Prior Publication Data

US 2021/0098646 A1    Apr. 1, 2021

(30) Foreign Application Priority Data

Sep. 27, 2019   (CN) .......................... 201910926819.3

(51) Int. Cl.
*H01L 33/00*   (2010.01)
*H01L 33/62*   (2010.01)
*H01L 25/075*   (2006.01)

(52) U.S. Cl.
CPC ...... *H01L 33/0095* (2013.01); *H01L 25/0753* (2013.01); *H01L 33/62* (2013.01)

(58) Field of Classification Search
CPC combination set(s) only.
See application file for complete search history.

(56) References Cited

U.S. PATENT DOCUMENTS

| 2020/0255286 | A1* | 8/2020 | Wen | .................. B81C 3/001 |
| 2020/0256842 | A1* | 8/2020 | Antoine | ............. G01N 27/3278 |

* cited by examiner

*Primary Examiner* — Ratisha Mehta
(74) *Attorney, Agent, or Firm* — Nath, Goldberg & Meyer; Joshua B. Goldberg

(57) ABSTRACT

The present disclosure provides a detection device for Micro-LED and a method manufacturing thereof, and a detection apparatus for Micro-LED, and the detection device for Micro-LED comprises: a substrate, and a first via and a second via penetrating through the substrate; the substrate comprises a first surface and a second surface which are opposite to each other; the first via and the second via are respectively arranged corresponding to a first pole and a second pole of a Micro-LED to be detected, and the detection device for Micro-LED further comprises: a first detection component and a second detection component on the first surface of the substrate.

20 Claims, 6 Drawing Sheets

US 11,342,480 B2

DETECTION DEVICE FOR MICRO-LED AND MANUFACTURING METHOD THEREOF, AND DETECTION APPARATUS FOR MICRO-LED

CROSS-REFERENCE TO RELATED APPLICATIONS

The present application claims the priority of the Chinese Patent Application No. 201910926819.3, filed on Sep. 27, 2019, the content of which is incorporated herein by reference in its entirety.

TECHNICAL FIELD

The present disclosure relates to the field of display technology, in particular, to a detection device for Micro-LED (Light-Emitting Diode) and a manufacturing method thereof, and a detection apparatus for Micro-LED.

BACKGROUND

A size of an LED is miniaturized to be less than 100 micrometers (μm) in Micro-LED display technology. A Micro-LED chip of micron level can be transferred and bonded to a driving substrate by a Mass Transfer technology, so as to form various Micro-LED display panels of different sizes.

SUMMARY

According to one aspect of the present disclosure, there is provided a detection device for Micro-LED including: a substrate, which has a first via and a second via penetrating therethrough, and a first surface and a second surface which are opposite to each other, wherein the first via and the second via correspond to a first pole and a second pole of a Micro-LED to be detected, respectively; and a first detection component and a second detection component on the first surface of the substrate, wherein, the first detection component comprises: a first electrode, a second electrode between the first electrode and the first via, and a third electrode fixedly coupled to the first electrode, on the first surface of the substrate; the third electrode comprises: a first fixed portion, a first cantilever beam portion, and a first movable portion, wherein a first end of the first cantilever beam portion is fixedly coupled to the first electrode through the first fixed portion, the first cantilever beam portion extends to the first via and is coupled to the first movable portion through a second end of the first cantilever beam portion such that the first movable portion is suspended in the first via, and a first preset distance originally exists between the first cantilever beam portion and the second electrode before detection of the micro LED; the second detection component comprises: a fourth electrode, a fifth electrode between the fourth electrode and the second via, and a sixth electrode fixedly coupled to the fourth electrode, on the first surface of the substrate; the sixth electrode comprises: a second fixed portion, a second cantilever beam portion, and a second movable portion, wherein a first end of the second cantilever beam portion is fixedly coupled to the fourth electrode through the second fixed portion, and the second cantilever beam portion extends to the second via and is coupled to the second movable portion through a second end of the second cantilever beam portion such that the second movable portion is suspended in the second via, and a second preset distance originally exists between the second cantilever beam portion and the fifth electrode before detection of the micro LED.

In some embodiments, the detection device further includes: a first fixed electrode at a side of the first electrode distal to the second electrode, a second fixed electrode at a side of the fourth electrode distal to the fifth electrode, a third fixed electrode between the first via and the second via, and a protection cover coupled to at least one of the first fixed electrode, the second fixed electrode and the third fixed electrode; wherein a connection end of the protection cover are bonded to the at least one of the first fixed electrode, the second fixed electrode, and the third fixed electrode.

In some embodiments, the first electrode, the second electrode, the fourth electrode, the fifth electrode, the first fixed electrode, the second fixed electrode, and the third fixed electrode are arranged in a same layer.

In some embodiments, a material of the first electrode, the second electrode, the fourth electrode, the fifth electrode, the first fixed electrode, the second fixed electrode, and the third fixed electrode comprises: aluminum; a material of the connection end of the protection cover comprises: germanium.

In some embodiments, the detection device for Micro-LED further includes: a planarization layer on the first electrode, the second electrode, the fourth electrode, the fifth electrode, the first fixed electrode, the second fixed electrode, and the third fixed electrode; and a buffer layer on the second surface of the substrate; wherein the first via penetrates through the planarization layer and the buffer layer; and the second via penetrates through the planarization layer and the buffer layer.

In some embodiments, the buffer layer has a thickness less than the first preset distance and less than the second preset distance.

In some embodiments, a material of the first fixed portion, the first cantilever beam portion, and the first movable portion of the third electrode comprises: silver or copper; a material of the second fixed portion, the second cantilever beam portion, and the second movable portion of the sixth electrode comprise: silver or copper.

In some embodiments, the substrate comprises glass.

In some embodiments, the first via and the second via each have a size smaller than that of each of the first pole and the second pole of the Micro-LED, and a distance between the first via and the second via is equal to that between the first pole and the second pole of the Micro-LED.

According to one aspect of the present disclosure, there is provided a detection apparatus for Micro-LED including a plurality of detection devices for Micro-LED, each of which is the detection device for Micro-LED above, wherein the plurality of detection devices for Micro-LED correspond to a plurality of Micro-LEDs to be tested one by one.

In some embodiments, the plurality of detection devices for Micro-LED are distributed in an array.

According to one aspect of the present disclosure, there is provided a method for manufacturing a detection device for Micro-LED including: forming a first via and a second via in a substrate to penetrate therethrough, wherein the substrate comprises a first surface and a second surface which are opposite to each other; and the first via and the second via correspond to a first pole and a second pole of a Micro-LED to be detected, respectively; forming a first electrode, a second electrode, a fourth electrode and a fifth electrode on the first surface of the substrate through a single patterning process, wherein the second electrode is between the first electrode and the first via, and the fifth electrode is between the fourth electrode and the second via; forming a third electrode and a sixth electrode through an electroplating process; wherein, the third electrode comprises: a first fixed portion, a first cantilever beam portion, and a first movable portion, wherein a first end of the first cantilever beam portion is fixedly coupled to the first electrode through the first fixed portion, the first cantilever beam portion extends to the first via and is coupled to the first movable portion through a second end of the first cantilever beam portion such that the first movable portion is suspended in the first via, and a first preset distance originally exists between the first cantilever beam portion and the second electrode before detection of the micro LED; and the sixth electrode comprises: a second fixed portion, a second cantilever beam portion, and a second movable portion, wherein a first end of the second cantilever beam portion is fixedly coupled to the fourth electrode through the second fixed portion, and the second cantilever beam portion extends to the second via and is coupled to the second movable portion through a second end of the second cantilever beam portion such that the second movable portion is suspended in the second via, and a second preset distance originally exists between the second cantilever beam portion and the fifth electrode before detection of the micro LED.

In some embodiments, the forming the first electrode, the second electrode, the fourth electrode and the fifth electrode on the first surface of the substrate through a single patterning process comprises: filling a resin material in the first via and the second via so that a surface of the resin material in the first via and the second via is flush with the second surface of the substrate; and depositing a first metal material on the first surface of the substrate, and etching the first metal material to form the first electrode, the second electrode, the fourth electrode and the fifth electrode.

In some embodiments, before forming the third electrode and the sixth electrode through the electroplating process, the method further includes: depositing a second metal material layer on the second surface of the substrate, and performing a patterning process on the second metal material layer to form a first block electrode and a second block electrode on the resin material at positions corresponding to the first via and the second via, respectively; and forming a buffer layer on the first block electrode, the second block electrode and an exposed part of the second surface of the substrate.

In some embodiments, the forming the third electrode and the sixth electrode through an electroplating process includes: forming a planarization layer on the first electrode, the second electrode, the fourth electrode, the fifth electrode and an exposed part of the first surface of the substrate; forming a sacrificial layer on the planarization layer; forming a mask layer on the sacrificial layer; patterning the mask layer to form a mask plate; etching the planarization layer and the sacrificial layer to form vias respectively extending to the first electrode, the fourth electrode, the first block electrode and the second block electrode with the mask plate; removing the mask plate; depositing a third metal material layer on the sacrificial layer, and performing a patterning process on the third metal material layer to form the third electrode coupled to the first electrode and the first block electrode, and the sixth electrode coupled to the fourth electrode and the second block electrode; and removing the sacrificial layer.

In some embodiments, the method for manufacturing a detection device for Micro-LED further includes: forming a first fixed electrode at a side of the first electrode distal to the second electrode, a second fixed electrode at a side of the fourth electrode distal to the fifth electrode, and a third fixed electrode between the first via and the second via on the first surface of the substrate through the single patterning process for forming the first electrode, the second electrode, the fourth electrode and the fifth electrode; forming vias extending respectively to the first fixed electrode, the second fixed electrode, and the third fixed electrode while forming the vias extending to the first electrode, the fourth electrode, the first block electrode, and the second block electrode; forming a protection cover encapsulating the first electrode, the second electrode, the third electrode, the fourth electrode, the fifth electrode, and the sixth electrode after removing the sacrificial layer; and bonding the protection cover to at least one of the first fixed electrode, the second fixed electrode, and the third fixed electrode.

In some embodiments, the method for manufacturing a detection device for Micro-LED further includes etching the first block electrode, the second block electrode, the buffer layer on the second surface of the substrate at positions corresponding to the first via and the second via and the resin material in the first via and the second via, such that the first via penetrates through the first block electrode and the buffer layer, and the second via penetrates through the second block electrode and the buffer layer.

In some embodiments, an orthographic projection of the first via on the substrate is within an orthographic projection of the first block electrode on the substrate, and an orthographic projection of the second via on the substrate is within an orthographic projection of the second block electrode on the substrate.

In some embodiments, the third metal material layer comprises molybdenum.

In some embodiments, the buffer layer has a thickness less than the first preset distance and less than the second preset distance.

DETAILED DESCRIPTION

In order to make those skilled in the art better understand the technical solutions of the present disclosure, the following detailed description is given with reference to the accompanying drawings and the specific embodiments.

The inventor finds that the Micro-LED chips provided by the supplier are generally directly transferred and bonded onto the driving substrate by Mass Transfer technology in the related art, and the Micro-LED chips are not detected and selected. During Mass Transfer, a small amount of Micro-LED chips are easily damaged due to the control deviation of pressure, alignment and the like, so that manufacturing yield of Micro-LED display panels is influenced, and display quality of the Micro-LED display panel is influenced.

Micro Electro Mechanical Systems (MEMS) technology refers to a technology for designing, processing, manufacturing, measuring and controlling micro/nano materials, and can integrate mechanical components, optical systems, driving components, and electronic control systems into a micro system as an integral unit. Among them, a MEMS switch is a specific application of the MEMS technology.

Figure 1A:
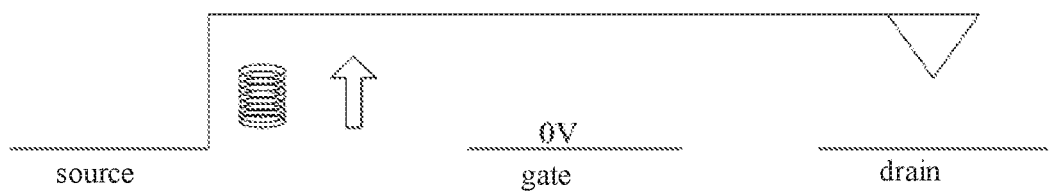
FIGS. 1a, 1b, and 1c are schematic diagrams illustrating an implementation principle of a MEMS switch.
Figure 1B:
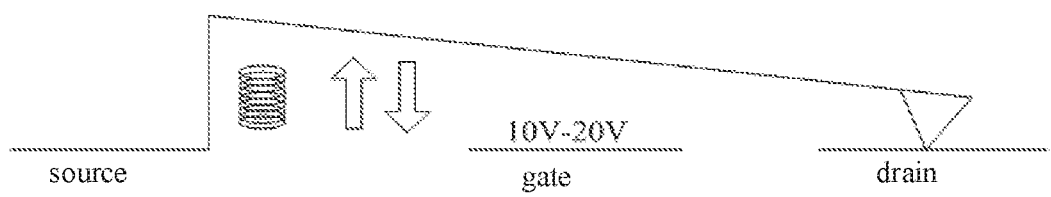
Figure 1C:
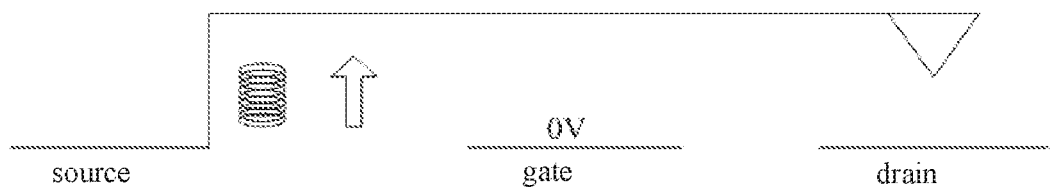

A MEMS switch has three connection terminals, which can be functionally regarded as a source, a gate, and a drain, respectively. FIGS. 1a, 1b, and 1c are schematic diagrams illustrating an implementation principle of a MEMS switch. As shown in FIG. 1a, when a voltage is not applied to the gate, that is, a gate voltage is 0 volt (V), the MEMS switch is turned-off. As shown in FIG. 1b, when a certain voltage, for example, in the range of 10 V-20 V, is applied to the gate, an electrostatic attraction force can be formed between the gate and a switch cantilever beam. When the gate voltage is high enough to generate a sufficiently large attraction force between the gate and the switch cantilever beam to overcome resistance of the spring, the switch cantilever beam may move downwards until a touch spot of the switch cantilever beam is in contact with the drain. Thus, the circuit between the source and the drain is conducting and the MEMS switch is turned on. As shown in FIG. 1c, when the voltage applied to the gate is removed and the gate voltage returns to 0 V, the electrostatic attraction between the gate and the switch cantilever beam disappears, the switch cantilever beam returns to an original position, the source and the drain are disconnected, and the MEMS switch returns to be turned off.

The detection device for Micro-LED provided in an embodiment of the disclosure may perform rapid and non-destructive detection on Micro-LEDs in a Mass Transfer process by using a MEMS switching technology. A detection device for Micro-LED and a manufacturing method thereof, and a detection apparatus for Micro-LED in the embodiments of the present disclosure will be described in further detail with reference to the accompanying drawings and the embodiments.

Figure 2A:
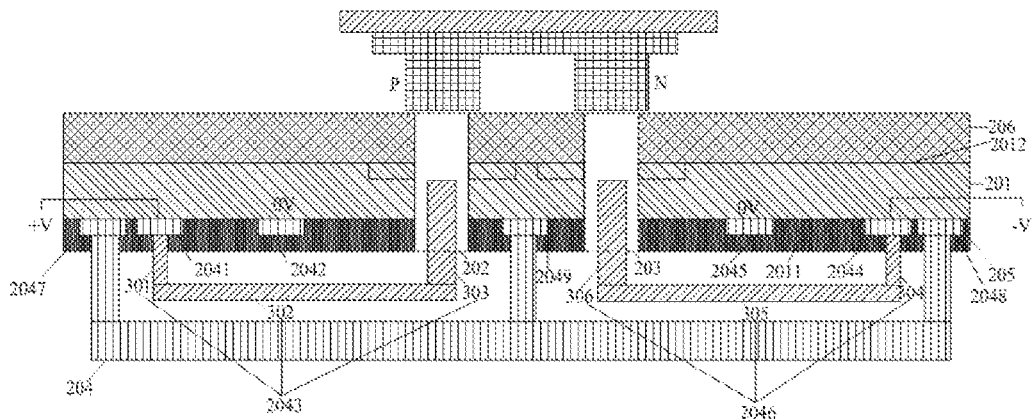
FIGS. 2a and 2b are schematic diagrams of a structure of a detection device for Micro-LED according to an embodiment of the present disclosure.
Figure 2B:
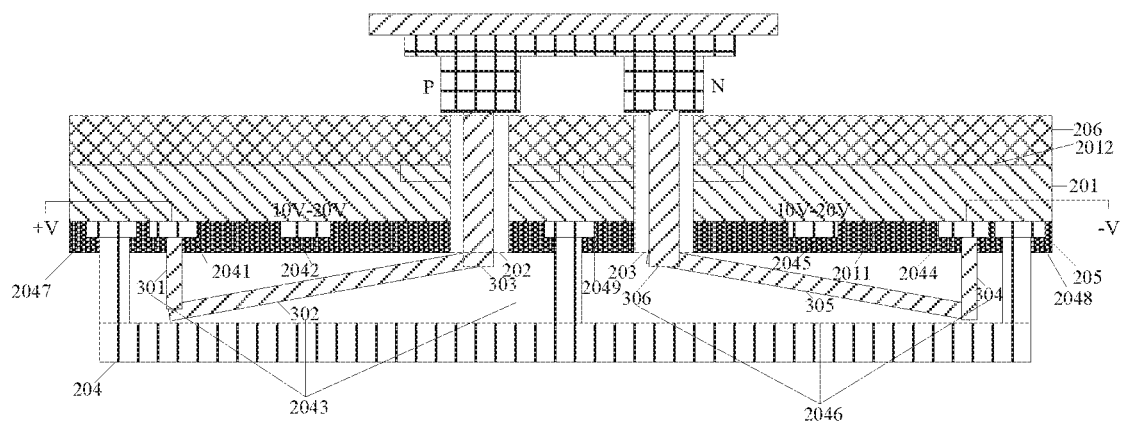

FIGS. 2a and 2b are schematic diagrams of a structure of a detection device for Micro-LED according to an embodiment of the present disclosure. As shown in FIG. 2a, the detection device for Micro-LED includes: a substrate 201, and a first via 202 and a second via 203 penetrating through the substrate 201. The substrate 201 includes a first surface 2011 and a second surface 2012 which are opposite to each other. The first via 202 and the second via 203 are arranged corresponding to a first pole P and a second pole N of the Micro-LED to be detected, respectively. The detection device for Micro-LED further includes: a first detection component and a second detection component on the first surface 2011 of the substrate 201. The first detection component includes: a first electrode 2041, a second electrode 2042 between the first electrode 2041 and the first via 202, and a third electrode 2043 fixedly coupled to the first electrode 2041, on the first surface 2011 of the substrate 201. The third electrode 2043 includes: a first fixed portion 301, a first cantilever beam portion 302, and a first movable portion 303. A first end of the first cantilever beam portion 302 is fixedly coupled to the first electrode 2041 through the first fixed portion 301, and the first cantilever beam portion 302 extends to the first via 202 and is coupled to the first movable portion 303 through a second end of the first cantilever beam portion 302 such that the first movable portion 303 is suspended in the first via 202. A first preset distance exists between the first cantilever beam portion 302 and the second electrode 2042. The second detection component includes: a fourth electrode 2044, a fifth electrode 2045 between the fourth electrode 2044 and the second via 203, and a sixth electrode 2046 fixedly coupled to the fourth electrode 2044, on the first surface 2011 of the substrate 201. The sixth electrode 2046 includes: a second fixed portion 304, a second cantilever beam portion 305, and a second movable portion 306. A first end of the second cantilever beam portion 305 is fixedly coupled to the fourth electrode 2044 through the second fixed portion 304. The second cantilever beam portion 305 extends to the second via 203 and is coupled to the second movable portion 306 through a second end of the second cantilever beam portion 305 such that the second movable portion 306 is suspended in the second via 203. A second preset distance exists between the second cantilever beam 305 and the fifth electrode 2045.

As shown in FIG. 2a, the first cantilever beam portion 302 extends towards the first via 202 until an projection of its other end (the second end of the first cantilever beam portion 302) on the substrate 201 falls into an projection of the first via 202 on the substrate 201. The first movable portion 303 is provided at the second end of the first cantilever beam portion 302 such that the first movable portion 303 is suspended in the first via 202 and extends in a direction along which the first via 202 extends. The second cantilever beam portion 305 extends towards the second via 203 until an projection of its other end (the second end of the second cantilever beam portion 305) on the substrate 201 falls into an projection of the second via 203 on the substrate 201. The second movable portion 306 is provided at the second end of the second cantilever beam portion 305 such that the second movable portion 306 is suspended in the second via 203 and extends in a direction along which the second via 203 extends.

It should be noted that, in the detection device for Micro-LED provided in the embodiment of the disclosure, the first electrode 2041 and the second electrode 2042 of the first detection component, and the fifth electrode 2045 and the fourth electrode 2044 of the second detection component may be respectively coupled to an external voltage supply module (not shown in the figure). Voltages applied to the first electrode 2041 and the fourth electrode 2044 may be a positive voltage and a negative voltage applied respectively to the first pole P and the second pole N when the Micro-LED to be detected works.

As shown in FIG. 2a, initially, no voltage is applied to the second electrode 2042 of the first detection component and the fifth electrode 2045 of the second detection component, that is, the voltage of each of the second electrode 2042 and the fifth electrode 2045 is 0V. At this time, there is the first preset distance between the first cantilever beam portion 302 and the second electrode 2042 of the first detection component, and there is the second preset distance between the second cantilever beam portion 305 and the fifth electrode 2045 of the second detection component. The first detection component is discoupled to the Micro-LED to be tested, and the second detection component is discoupled to the Micro-LED to be tested. It should be noted that, the first preset distance may be equal or not equal to the second preset distance. In the embodiment of the present disclosure, the first preset distance is equal to the second preset distance, which can reduce the difficulty in the manufacturing process of the detection device for Micro-LED.

As shown in FIG. 2b, when a voltage is applied to the second electrode 2042 and a positive voltage from the external voltage supply module is applied to the third electrode 2043 through the first electrode 2041, a voltage difference between the third electrode 2043 and the second electrode 2042 may be generated, and thus an electrostatic attraction force may be generated between the third electrode 2043 and the second electrode 2042. Since only the first end of the third electrode 2043 is fixed and the second end of the third electrode 2043 is suspended, the first cantilever beam portion 302 of the third electrode 2043 is attracted by the second electrode 2042 due to the electrostatic attraction force, such that the first movable portion 303 of the third electrode 2043 is pulled up to be in contact with the first pole P of the Micro-LED to be detected. Meanwhile, when a voltage is also applied to the fifth electrode 2045 and a negative voltage from the external voltage supply module may be applied to the sixth electrode 2046 through the fourth electrode 2044, a voltage difference between the sixth electrode 2046 and the fifth electrode 2045 may be generated, and therefore, an electrostatic attraction force may be generated between the sixth electrode 2046 and the fifth electrode 2045. Since only the first end of the sixth electrode 2046 is fixed and the second end of the sixth electrode 2046 is suspended, the second cantilever beam portion 305 of the sixth electrode 2046 is attracted by the fifth electrode 2045 due to the electrostatic attraction force, such that the second movable portion 305 of the sixth electrode 2046 is pulled up to be in contact with the second pole N of the Micro-LED to be detected. The first detection component and the second detection component in the detection device for Micro-LED are electrically coupled to the Micro-LED to be detected, the first pole P and the second pole N of the Micro-LED may be respectively applied with a positive voltage and a negative voltage in a normal working state, and the Micro-LED of fault free can be lit, such that rapid detection of the Micro-LED in a Mass Transfer process is realized. Meanwhile, each electrode in the detection device is driven by static electricity, which has weak attraction force, and the Micro-LED to be detected may not be damaged, such that nondestructive detection of the Micro-LED may be realized. As such, transfer efficiency of the Micro-LEDs may be improved, and the manufacturing yield of the display panels may be improved.

Optionally, a voltage applied to each of the second electrode 2042 and the fifth electrode 2045 may be a lower voltage in a range between 10V and 20V, thereby preventing damage to the Micro-LED due to an excessively high voltage.

As shown in FIG. 2a, the detection device for Micro-LED further includes: a first fixed electrode 2047 at a side of the first electrode 2041 distal to the second electrode 2042, a second fixed electrode 2048 at a side of the fourth electrode 2044 distal to the fifth electrode 2045, a third fixed electrode 2049 between the first via 202 and the second via 203, and a protection cover 204 at least coupled to the first fixed electrode 2047 and the second fixed electrode 2048. A connection end of the protection cover 204 is bonded to at least one of the first fixed electrode 2047, the second fixed electrode 2048, and the third fixed electrode 2049.

It should be noted that, the protection cover 204 may be a silicon cap structure made of silicon, and may insulate each electrode inside the detection device from the outside, so as to protect the detection device and prevent the electrodes inside the detection device from being damaged in the detection process. The connection end of the protection cover 204 may be coupled to at least the first fixed electrode 2047 and the second fixed electrode 2048 by bonding, so as to fix the protection cover to the first detection component and the second detection component. In an embodiment of the present disclosure, the connection end of the protection cover 204 may be respectively coupled to the first fixed electrode 2047, the second fixed electrode 2048, and the third fixed electrode 2049.

Optionally, the first electrode 2041, the second electrode 2042, the fourth electrode 2044, the fifth electrode 2045, the first fixed electrode 2047, the second fixed electrode 2048 and the third fixed electrode 2049 are disposed in a same layer.

It should be noted that, in an embodiment of the present disclosure, the first electrode 2041, the second electrode 2042, the fourth electrode 2044, the fifth electrode 2045, the first fixed electrode 2047, the second fixed electrode 2048, and the third fixed electrode 2049 may be in a same layer, so as to reduce a thickness of the detection device for Micro-LED. In the manufacturing process, each of the first electrode 2041, the second electrode 2042, the fourth electrode 2044, the fifth electrode 2045, the first fixed electrode 2047, the second fixed electrode 2048, and the third fixed electrode 2049 can be formed at one time by a single patterning process, so that the difficulty in the manufacturing process can be reduced, and the manufacturing cost can be lowered.

Optionally, a material of the first electrode 2041, the second electrode 2042, the fourth electrode 2044, the fifth electrode 2045, the first fixed electrode 2047, the second fixed electrode 2048 and the third fixed electrode 2049 includes: aluminum. A material of the connection end of the protection cover 204 includes: germanium.

It should be noted that, the first electrode 2041, the second electrode 2042, the fourth electrode 2044, the fifth electrode 2045, the first fixed electrode 2047, the second fixed electrode 2048, and the third fixed electrode 2049 may be made of aluminum, which not only ensures good electrical conductivity, but also reduces the manufacturing cost. The connection end of the protection cover 204 may be made of germanium, and may be coupled to the first fixed electrode 2047, the second fixed electrode 2048, and the third fixed electrode 2049 through bonding, so as to protect each of the first electrode 2041, the second electrode 2042, the fourth electrode 2044, the fifth electrode 2045.

Optionally, as shown in FIG. 2a, the detection device for Micro-LED further includes: a planarization layer 205 on the first electrode 2041, the second electrode 2042, the fourth electrode 2044, the fifth electrode 2045, the first fixed electrode 2047, the second fixed electrode 2048, and the third fixed electrode 2049; and a buffer layer 206 on the second surface 2012 of the substrate 201. The first via 202 penetrates through the planarization layer 205 and the buffer layer 206. The second via 203 penetrates through the planarization layer 205 and the buffer layer 206.

It should be noted that, the planarization layer 205 can make a surface of each of the first electrode 2041, the second electrode 2042, the fourth electrode 2044, the fifth electrode 2045, the first fixed electrode 2047, the second fixed electrode 2048, and the third fixed electrode 2049 to be flat, so as to avoid uneven surfaces of the first electrode 2041, the second electrode 2042, the fourth electrode 2044, the fifth electrode 2045, the first fixed electrode 2047, the second fixed electrode 2048, and the third fixed electrode 2049, which may affect the fabrication of other subsequent layers thereon. The buffer layer 206 may buffer the Micro-LED to be detected during the detection process, so as to avoid damage to the Micro-LED during the detection process.

Optionally, a thickness of the buffer layer 206 is smaller than each of the first preset distance and the second preset distance.

It should be noted that, in an embodiment of the present disclosure, since the thickness of the buffer layer 206 may be smaller than the first preset distance and the second preset distance, it is ensured that the third electrode 2043 and the sixth electrode 2046 may respectively contact with the first pole P and the second pole N of the Micro-LED to be detected when the detection device for Micro-LED is electrically coupled to the Micro-LED to be detected in a conducting state. Then, the first pole P and the second pole N of the Micro-LED are respectively applied with a positive voltage and a negative voltage, and a Micro-LED of fault free will be lit, thereby realizing detection and selection of the Micro-LED. Optionally, a size of each of the first and second vias 202 and 203 is smaller than a size of each of the first pole P and the second pole N of the Micro-LED, so that the Micro-LED may be stably placed on the detection device. And, the Micro-LED includes two poles, and the distance between the first via 202 and the second via 203 is equal to the distance between the two poles of the Micro-LED, so as to facilitate the detection of the Micro-LED.

Optionally, a material of each of the first fixed portion 301, the first cantilever beam portion 302 and the first movable portion 303 of the third electrode 2043 includes: silver or copper. A material of each of the second fixed portion 304, the second cantilever beam portion 305, and the second movable portion 306 of the sixth electrode 2046 includes: silver or copper.

It should be noted that, the material of the third electrode 2043 and the sixth electrode 2046 may be silver or copper with good conductivity. In order to reduce the manufacturing cost and the process difficulty, in an embodiment of the present disclosure, the material of the third electrode 2043 and the sixth electrode 2046 may be copper.

Optionally, a material of the substrate 201 includes glass.

It should be noted that, based on the size of the Micro-LED to be detected, a glass substrate with a suitable size may be selected, and vias may be pre-arranged in the glass substrate. The detection device may be in contact with and electrically coupled to the first pole P and the second pole N of the Micro-LED to be detected through the vias, thereby realizing detection and selection of the Micro-LED.

According to an aspect of the present disclosure, a detection apparatus for Micro-LED is provided in an embodiment of the present disclosure, and may include the detection device for Micro-LED in the above embodiments. It should be understood that, there are a plurality of Micro-LEDs to be detected, and in practical applications there may be a large amount of Micro-LEDs, and there are a plurality of detection devices for Micro-LED in the detection apparatus and the plurality of detection devices have a one-to-one correspondence with the Micro-LEDs. The plurality of detection devices for Micro-LED may be distributed in an array.

It should be noted that the implementation principle of the detection apparatus for Micro-LED provided in the embodiment of the present disclosure is similar to that of the detection devices for Micro-LED provided in the above embodiment, and details are not repeated here.

Figure 3:
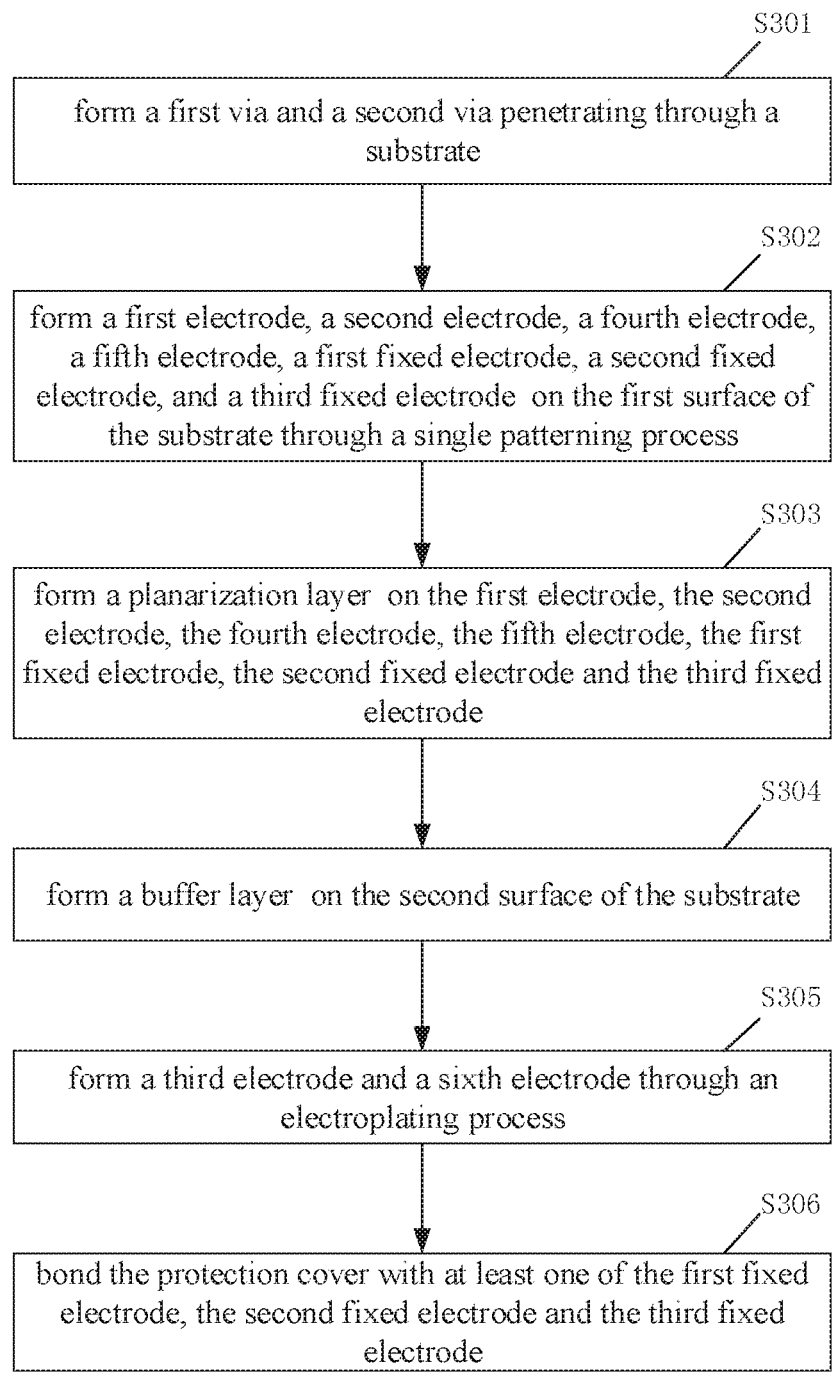
FIG. 3 is a schematic flow chart of a method for manufacturing a detection device for Micro-LED according to an embodiment of the present disclosure.

Based on a same concept, a method for manufacturing a detection device for Micro-LED is provided in an embodiment of the present disclosure. FIG. 3 is a schematic flow chart of a method for manufacturing the detection device for Micro-LED provided in an embodiment of the present disclosure. As shown in FIG. 3, the method for manufacturing the detection device for Micro-LED includes the following steps.

S301, a first via and a second via penetrating through a substrate are formed.

Figure 4A:
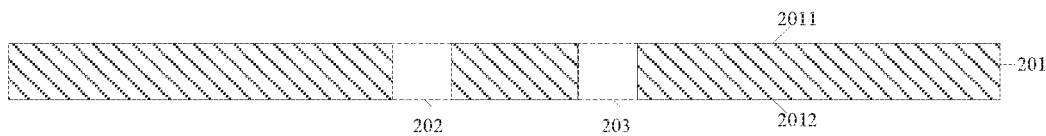
FIGS. 4a to 4k are schematic diagrams illustrating steps in a method for manufacturing a detection device for Micro-LED according to an embodiment of the present disclosure.
Figure 4B:
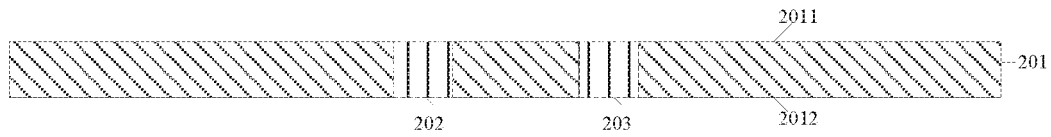

As shown in FIG. 4a, in an embodiment of the present disclosure, a first via 202 and a second via 203 are formed in a substrate 201. The first via 202 and the second via 203 correspond to a first pole P and a second pole N of a Micro-LED to be detected, respectively. The substrate 201 includes a first surface 2011 and a second surface 2012 which are opposite to each other. Then, as shown in FIG. 4b, a resin material is filled into the first via 202 and the second via 203 to provide a planarization substrate for the subsequent preparation of other film layers.

S302, a first electrode, a second electrode, a fourth electrode, a fifth electrode, a first fixed electrode, a second fixed electrode, and a third fixed electrode are formed on the first surface of the substrate through a single patterning process.

Figure 4C:
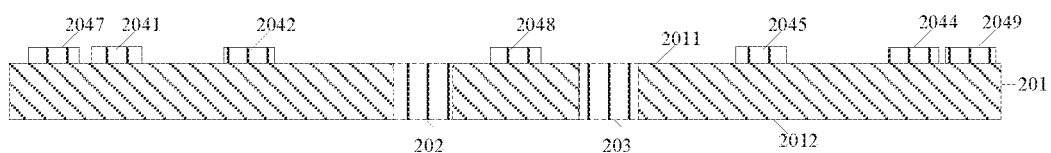

As shown in FIG. 4c, a metal layer is formed by depositing a metal material on the first surface 2011 of the substrate 201. In an embodiment of the present disclosure, the material of the metal layer may be aluminum. The deposited metal layer is etched to form a first electrode 2041, a second electrode 2042, a fourth electrode 2044, a fifth electrode 2045, a first fixed electrode 2047, a second fixed electrode 2048 and a third fixed electrode 2049 which are disconnected with each other.

S303, a planarization layer is formed on the first electrode 2041, the second electrode 2042, the fourth electrode 2044, the fifth electrode 2045, the first fixed electrode 2047, the second fixed electrode 2048 and the third fixed electrode 2049.

Figure 4D:
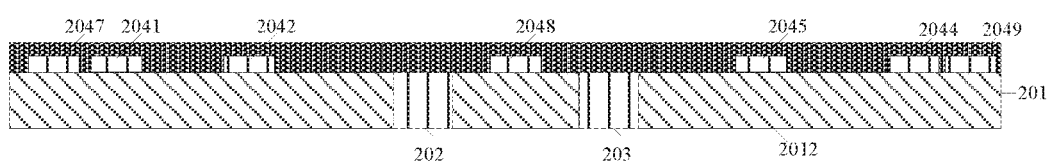
Figure 4E:
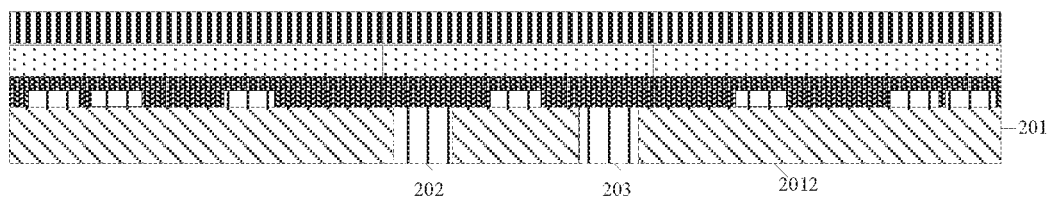

As shown in FIG. 4d, a planarization layer 205 is formed on each of the first electrode 2041, the second electrode 2042, the fourth electrode 2044, the fifth electrode 2045, the first fixed electrode 2047, the second fixed electrode 2048 and the third fixed electrode 2049, and the planarization layer 205 may make a surface of each of the first electrode 2041, the second electrode 2042, the fourth electrode 2044, the fifth electrode 2045, the first fixed electrode 2047, the second fixed electrode 2048 and the third fixed electrode 2049 flat. Thereafter, as shown in FIG. 4e, a sacrificial layer and a silicon nitride layer are formed successively on the planarization layer 205 to form a structure.

S304, a buffer layer is formed on the second surface of the substrate.

Figure 4F:
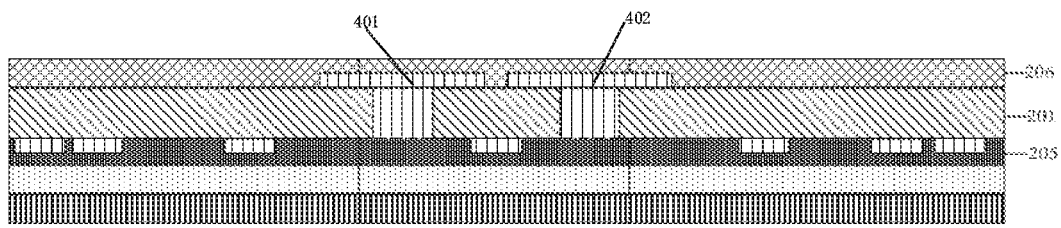

As shown in FIG. 4f, the formed structure is inverted so that the second surface 2012 of the substrate 201 is facing upwards. An electrode layer may be formed on the second surface 2012 of the substrate 201, and is patterned to form two block electrodes corresponding to the first via 202 and the second via 203. An orthographic projection of the first via 202 on the substrate is within an orthographic projection of the first block electrode 401 on the substrate, and an orthographic projection of the second via 203 on the substrate is within an orthographic projection of the second block electrode 402 on the substrate. A material of the two block electrodes may be molybdenum. A buffer layer 206 is formed on the second surface 2012 of the substrate 201 provided with the two block electrodes. The buffer layer 206 may buffer the Micro-LED to be detected, so as to avoid damage to the Micro-LED in the detection process.

S305, a third electrode and a sixth electrode is formed through an electroplating process.

Figure 4G:
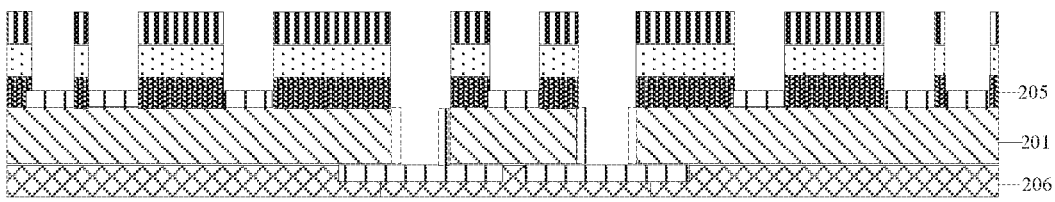
Figure 4H:
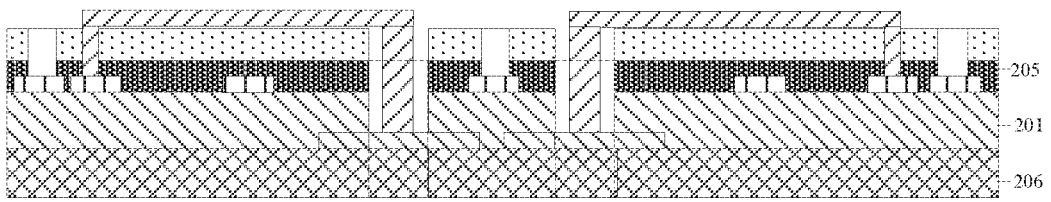
Figure 4I:
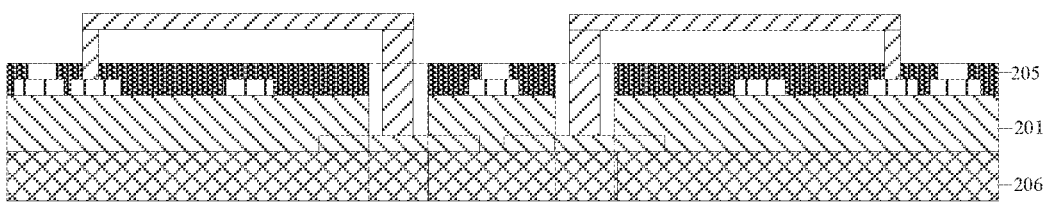

As shown in FIG. 4g, the silicon nitride layer may be patterned as a mask for a following etch process to form a plurality of vias for connecting the third electrode 2043, the sixth electrode 2046, and the protection cover 204. As shown in FIG. 4h, the silicon nitride layer is etched away, and a third electrode 2043 coupled to the first electrode 2041 and a sixth electrode 2046 coupled to the fourth electrode 2044 are formed from a copper material by an electroplating process. The two block electrodes may provide electrodes for the electroplating process while preventing the buffer layer 206 from being etched away, so as to form the third electrode 2043 and the sixth electrode 2046 by the electroplating process. The third electrode 2043 is formed to include: a first fixed portion 301, a first cantilever beam portion 302, and a first movable portion 303. A first end of the first cantilever beam portion 302 is fixedly coupled to the first electrode 2041 through the first fixed portion 301, and the first cantilever beam portion 302 extends to the first via and is coupled to the first movable portion 303 through a second end of the first cantilever beam portion 302 so that the first movable portion 303 is suspended in the first via 202. A first preset distance exists between the first cantilever beam portion 301 and the second electrode 2042. The sixth electrode 2046 includes: a second fixed portion 304, a second cantilever beam portion 305, and a second movable portion 306. A first end of the second cantilever beam portion 305 is fixedly coupled to the fourth electrode 2044 through the second fixed portion 304, and the second cantilever beam portion 305 extends to the second via and is coupled to the second movable portion 306 through a second end of the second cantilever beam portion 305 so that the second movable portion 306 is suspended in the second via 203. A second preset distance exists between the second cantilever beam 305 and the fifth electrode 2045. As shown in FIG. 4i, the sacrificial layer on the planarization layer 205 is removed, and finally the third electrode 2043 and the sixth electrode 2046 are formed.

S306, the protection cover is bonded with at least one of the first fixed electrode, the second fixed electrode and the third fixed electrode.

Figure 4J:
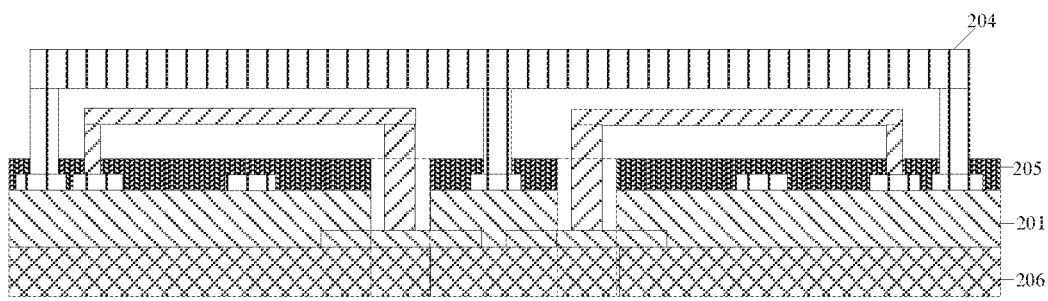
Figure 4K:
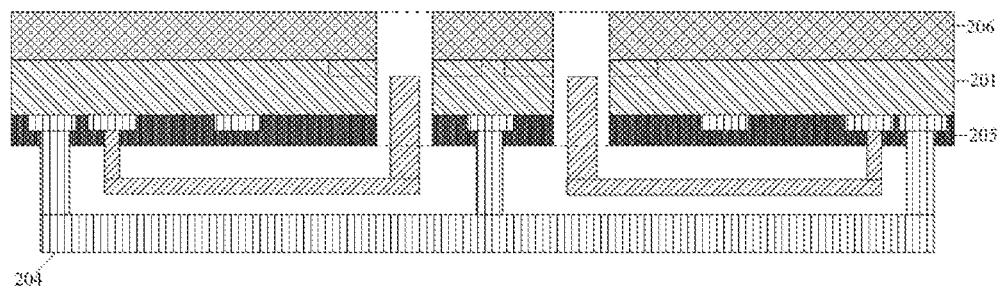

As shown in FIG. 4j, in an embodiment of the disclosure, the protection cover 204 is fixedly coupled to the first fixed electrode 2047, the second fixed electrode 2048, and the third fixed electrode 2049 by bonding, so as to protect each electrode inside the detection device. Then, as shown in FIG. 4k, the buffer layer 206 and the two block electrodes on the second surface 2012 of the substrate 201 are etched at positions corresponding to the two poles of the Micro-LED to be detected to form openings, so that the first movable portion 303 of the third electrode 2043 and the second movable portion 306 of the sixth electrode 2046 are exposed to be respectively intended to be contact with and coupled to the two poles of the Micro-LED to be detected in the detection process.

Optionally, a thickness of the buffer layer 206 is smaller than each of the first preset distance and the second preset distance.

It should be noted that, in an embodiment of the present disclosure, the thickness of the buffer layer 206 may be smaller than each of the first preset distance and the second preset distance, so as to ensure that when the detection device for Micro-LED and the Micro-LED to be detected are electrically coupled to each other in a conducting state, the third electrode 2043 and the sixth electrode 2046 may respectively contact with the first pole P and the second pole N of the Micro-LED to be detected. Then, the first pole P and the second pole N of the Micro-LED are respectively applied with a positive voltage and a negative voltage, and a Micro-LED of fault free will be lit, thereby achieving detection and selection of the Micro-LED.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A detection device for Micro-LED, comprising:
   a substrate, which has a first via and a second via penetrating therethrough, and a first surface and a second surface which are opposite to each other, wherein the first via and the second via correspond to a first pole and a second pole of a Micro-LED to be detected, respectively; and
   a first detection component and a second detection component on the first surface of the substrate, wherein,
   the first detection component comprises: a first electrode, a second electrode between the first electrode and the first via, and a third electrode fixedly coupled to the first electrode, on the first surface of the substrate;
   the third electrode comprises: a first fixed portion, a first cantilever beam portion, and a first movable portion, wherein a first end of the first cantilever beam portion is fixedly coupled to the first electrode through the first fixed portion, the first cantilever beam portion extends to the first via and is coupled to the first movable portion through a second end of the first cantilever beam portion such that the first movable portion is suspended in the first via, and a first preset distance originally exists between the first cantilever beam portion and the second electrode before detection of the micro LED;
   the second detection component comprises: a fourth electrode, a fifth electrode between the fourth electrode and the second via, and a sixth electrode fixedly coupled to the fourth electrode, on the first surface of the substrate;
   the sixth electrode comprises: a second fixed portion, a second cantilever beam portion, and a second movable portion, wherein a first end of the second cantilever beam portion is fixedly coupled to the fourth electrode through the second fixed portion, and the second cantilever beam portion extends to the second via and is coupled to the second movable portion through a second end of the second cantilever beam portion such that the second movable portion is suspended in the second via, and a second preset distance originally exists between the second cantilever beam portion and the fifth electrode before detection of the micro LED.

2. The detection device for Micro-LED of claim 1, further comprising: a first fixed electrode at a side of the first electrode distal to the second electrode, a second fixed electrode at a side of the fourth electrode distal to the fifth electrode, a third fixed electrode between the first via and the second via, and a protection cover coupled to at least one of the first fixed electrode, the second fixed electrode and the third fixed electrode;
   wherein a connection end of the protection cover are bonded to the at least one of the first fixed electrode, the second fixed electrode, and the third fixed electrode.

3. The detection device for Micro-LED of claim 2, wherein the first electrode, the second electrode, the fourth electrode, the fifth electrode, the first fixed electrode, the second fixed electrode, and the third fixed electrode are arranged in a same layer.

4. The detection device for Micro-LED of claim 3, wherein a material of the first electrode, the second electrode, the fourth electrode, the fifth electrode, the first fixed electrode, the second fixed electrode, and the third fixed electrode comprises: aluminum;
a material of the connection end of the protection cover comprises: germanium.

5. The detection device for Micro-LED of claim 4, further comprising: a planarization layer on the first electrode, the second electrode, the fourth electrode, the fifth electrode, the first fixed electrode, the second fixed electrode, and the third fixed electrode; and a buffer layer on the second surface of the substrate; wherein
the first via penetrates through the planarization layer and the buffer layer; and
the second via penetrates through the planarization layer and the buffer layer.

6. The detection device for Micro-LED of claim 5, wherein the buffer layer has a thickness less than the first preset distance and less than the second preset distance.

7. The detection device for Micro-LED of claim 1, wherein a material of the first fixed portion, the first cantilever beam portion, and the first movable portion of the third electrode comprises: silver or copper;
a material of the second fixed portion, the second cantilever beam portion, and the second movable portion of the sixth electrode comprise: silver or copper.

8. The detection device for Micro-LED of claim 1, wherein the substrate comprises glass.

9. The detection device for Micro-LED of claim 1, wherein the first via and the second via each have a size smaller than that of each of the first pole and the second pole of the Micro-LED, and a distance between the first via and the second via is equal to that between the first pole and the second pole of the Micro-LED.

10. A detection apparatus for Micro-LED, comprising a plurality of detection devices for Micro-LED, each of which is the detection device for Micro-LED of claim 1, wherein the plurality of detection devices for Micro-LED correspond to a plurality of Micro-LEDs to be tested one by one.

11. The detection apparatus for Micro-LED of claim 10, wherein the plurality of detection devices for Micro-LED are distributed in an array.

12. A method for manufacturing a detection device for Micro-LED comprising:
forming a first via and a second via in a substrate to penetrate therethrough, wherein the substrate comprises a first surface and a second surface which are opposite to each other; and the first via and the second via correspond to a first pole and a second pole of a Micro-LED to be detected, respectively;
forming a first electrode, a second electrode, a fourth electrode and a fifth electrode on the first surface of the substrate through a single patterning process, wherein the second electrode is between the first electrode and the first via, and the fifth electrode is between the fourth electrode and the second via;
forming a third electrode and a sixth electrode through an electroplating process; wherein,
the third electrode comprises: a first fixed portion, a first cantilever beam portion, and a first movable portion, wherein a first end of the first cantilever beam portion is fixedly coupled to the first electrode through the first fixed portion, the first cantilever beam portion extends to the first via and is coupled to the first movable portion through a second end of the first cantilever beam portion such that the first movable portion is suspended in the first via, and a first preset distance originally exists between the first cantilever beam portion and the second electrode before detection of the micro LED; and
the sixth electrode comprises: a second fixed portion, a second cantilever beam portion, and a second movable portion, wherein a first end of the second cantilever beam portion is fixedly coupled to the fourth electrode through the second fixed portion, and the second cantilever beam portion extends to the second via and is coupled to the second movable portion through a second end of the second cantilever beam portion such that the second movable portion is suspended in the second via, and a second preset distance originally exists between the second cantilever beam portion and the fifth electrode before detection of the micro LED.

13. The method for manufacturing a detection device for Micro-LED of claim 12, wherein the forming the first electrode, the second electrode, the fourth electrode and the fifth electrode on the first surface of the substrate through a single patterning process comprises:
filling a resin material in the first via and the second via so that a surface of the resin material in the first via and the second via is flush with the second surface of the substrate; and
depositing a first metal material on the first surface of the substrate, and etching the first metal material to form the first electrode, the second electrode, the fourth electrode and the fifth electrode.

14. The method for manufacturing a detection device for Micro-LED of claim 13, before forming the third electrode and the sixth electrode through the electroplating process, the method further comprises:
depositing a second metal material layer on the second surface of the substrate, and performing a patterning process on the second metal material layer to form a first block electrode and a second block electrode on the resin material at positions corresponding to the first via and the second via, respectively; and
forming a buffer layer on the first block electrode, the second block electrode and an exposed part of the second surface of the substrate.

15. The method for manufacturing a detection device for Micro-LED of claim 14, wherein the forming the third electrode and the sixth electrode through an electroplating process comprises:
forming a planarization layer on the first electrode, the second electrode, the fourth electrode, the fifth electrode and an exposed part of the first surface of the substrate;
forming a sacrificial layer on the planarization layer;
forming a mask layer on the sacrificial layer;
patterning the mask layer to form a mask plate;
etching the planarization layer and the sacrificial layer to form vias respectively extending to the first electrode, the fourth electrode, the first block electrode and the second block electrode with the mask plate;
removing the mask plate;
depositing a third metal material layer on the sacrificial layer, and performing a patterning process on the third metal material layer to form the third electrode coupled to the first electrode and the first block electrode, and the sixth electrode coupled to the fourth electrode and the second block electrode; and
removing the sacrificial layer.

16. The method for manufacturing a detection device for Micro-LED of claim 15, further comprising:

forming a first fixed electrode at a side of the first electrode distal to the second electrode, a second fixed electrode at a side of the fourth electrode distal to the fifth electrode, and a third fixed electrode between the first via and the second via on the first surface of the substrate through the single patterning process for forming the first electrode, the second electrode, the fourth electrode and the fifth electrode;

forming vias extending respectively to the first fixed electrode, the second fixed electrode, and the third fixed electrode while forming the vias extending to the first electrode, the fourth electrode, the first block electrode, and the second block electrode;

forming a protection cover encapsulating the first electrode, the second electrode, the third electrode, the fourth electrode, the fifth electrode, and the sixth electrode after removing the sacrificial layer; and bonding the protection cover to at least one of the first fixed electrode, the second fixed electrode, and the third fixed electrode.

17. The method for manufacturing a detection device for Micro-LED of claim 16, further comprising etching the first block electrode, the second block electrode, the buffer layer on the second surface of the substrate at positions corresponding to the first via and the second via and the resin material in the first via and the second via, such that the first via penetrates through the first block electrode and the buffer layer, and the second via penetrates through the second block electrode and the buffer layer.

18. The method for manufacturing a detection device for Micro-LED of claim 17, wherein an orthographic projection of the first via on the substrate is within an orthographic projection of the first block electrode on the substrate, and an orthographic projection of the second via on the substrate is within an orthographic projection of the second block electrode on the substrate.

19. The method for manufacturing a detection device for Micro-LED of claim 18, wherein the third metal material layer comprises molybdenum.

20. The method for manufacturing a detection device for Micro-LED of claim 19, wherein the buffer layer has a thickness less than the first preset distance and less than the second preset distance.

\* \* \* \* \*